United States Patent
Miyazaki et al.

(10) Patent No.: US 7,692,305 B2
(45) Date of Patent: Apr. 6, 2010

(54) POWER FEED DEVICE TO POWER PINS OF ELECTRICAL COMPONENT

(75) Inventors: Takehide Miyazaki, Kawasaki (JP); Hirofumi Imabayashi, Kawasaki (JP); Katsumi Kanasaki, Kawasaki (JP); Akira Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 586 days.

(21) Appl. No.: 11/316,861

(22) Filed: Dec. 27, 2005

(65) Prior Publication Data

US 2007/0075431 A1    Apr. 5, 2007

(30) Foreign Application Priority Data

Sep. 30, 2005    (JP) .............................. 2005-286715

(51) Int. Cl.
*H01L 23/48*    (2006.01)
*H01L 23/52*    (2006.01)

(52) U.S. Cl. .................. 257/773; 257/664; 257/693; 257/698; 257/730; 257/E23.011; 257/E23.079; 257/E23.145; 257/E23.174; 361/601; 361/760

(58) Field of Classification Search ............... 257/668, 257/690–698, 777; 361/760
See application file for complete search history.

(56) References Cited

U.S. PATENT DOCUMENTS 6,853,559 B2* 2/2005 Panella et al. ............... 361/764
7,057,272 B2* 6/2006 Koide ......................... 257/691

FOREIGN PATENT DOCUMENTS

| JP | 2-3957 | 1/1990 |
| JP | 6-223632 | 8/1994 |
| JP | 7-120227 | 12/1995 |

* cited by examiner

*Primary Examiner*—Jasmine J Clark
(74) *Attorney, Agent, or Firm*—Staas & Halsey LLP (57) ABSTRACT

A power feed device for an electrical component which improves the quality of transmission and reduces the mounting density of a printed circuit board in the power feed device or reduces the thickness of the printed circuit board and thereby realizes smaller size, provided with a power supply for supplying power, a printed circuit board having built-in signal line patterns, and a power bar having conductive projections provided in shapes and at positions corresponding to the shapes and positions of electrodes of the electrical component and provided outside of the printed circuit board, power from the power supply being supplied through the conductive projections of the power bar to electrodes of the electrical component.

3 Claims, 9 Drawing Sheets

POWER FEED DEVICE TO POWER PINS OF ELECTRICAL COMPONENT

CROSS-REFERENCE TO RELATED APPLICATIONS

This application is based upon and claims a priority of Japanese Patent Application No. 2005-286715 filed on Sep. 30, 2005, the contents of which being incorporated herein by reference.

BACKGROUND OF THE INVENTION

1. Field of the Invention

The present invention relates to a power feed device to power pins of an electrical component, more particularly relates to a power feed device designed to feed power to various types of power pins of a ball gate array (BGA) or other electrical component from an on board power (OBP) or other power supply without going through patterns included in a printed circuit board but by instead arranging a power bar outside of the printed circuit board and going through that power bar.

2. Description of the Related Art

In recent years, the reduction in the noise margin of the power supply system accompanying the lower drive voltages of electrical components such as BGAs and the noise between the power and ground accompanying simultaneous switching waveforms are becoming major problems.

Figure 1A:
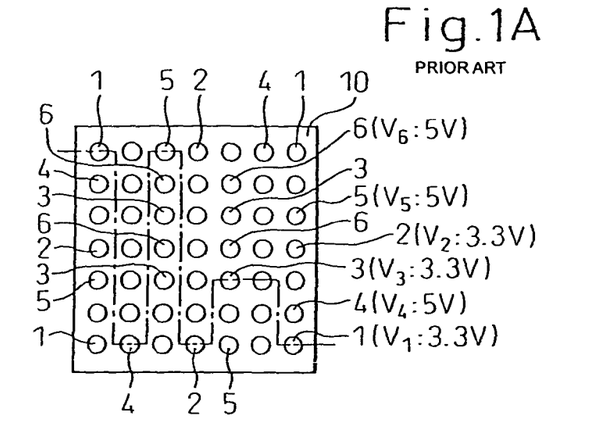

FIG. 1A is a plan view, seen from below, of a BGA fed with power by a conventional power feed device. In the figure, 10 indicates a BGA at the back side of which power pins 1 to 6 are arranged at predetermined positions in the row direction and column direction by solder balls. Each power pin 1 is an electrode supplied with for example a 3.3V power voltage $V_1$. Each power pin 2 is an electrode supplied with for example a 3.3V reference voltage $V_2$. Each power pin 3 is an electrode supplied with for example a 3.3V auxiliary power voltage $V_3$. Each power pin 4 is an electrode supplied with for example a 5V power voltage $V_4$. Each power pin 5 is an electrode supplied with for example a 5V reference voltage $V_5$. Each power pin 6 is an electrode supplied with for example a 5V auxiliary power voltage $V_6$.

Figure 1B:
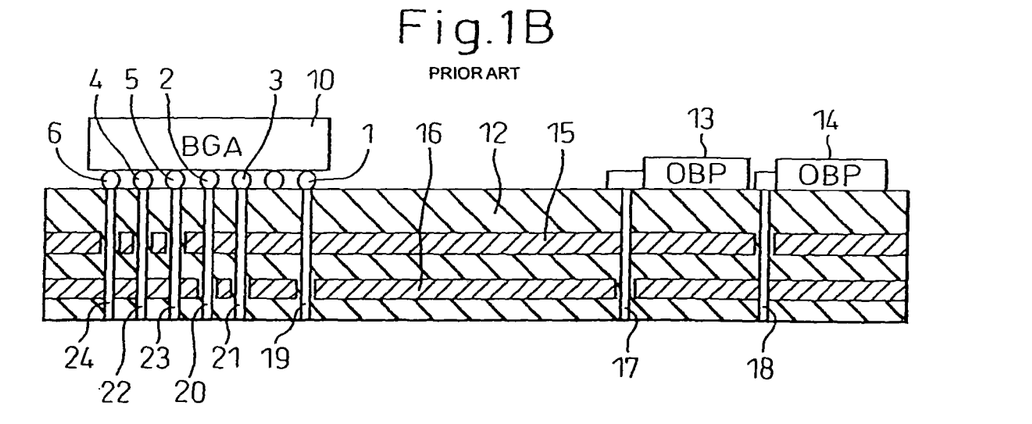
FIG. 1B is a cross-sectional view showing an example of a conventional power feed device.

FIG. 1B is a cross-sectional view showing one example of a conventional power feed device. In the figure, 12 indicates a printed circuit board arranged below the BGA 10, 13 indicates an OBP arranged on the printed circuit board 12 and generating a 3.3V voltage, 14 indicates an OBP arranged on the printed circuit board 12 and generating a 5V voltage, 15 indicates a copper foil power layer included in the printed circuit board 12 and forming a 3.3V power layer, 16 indicates a copper foil power layer included in the printed circuit board 12 and forming a 5V power layer, 17 indicates a via passing through the printed circuit board 12 for supplying the OBP 13 output voltage 3.3V to the power layer 15, 18 indicates a via passing through the printed circuit board 12 for supplying the OBP 14 output voltage 5V to the power layer 16, and 19 to 24 are vias passing through the printed circuit board 12 corresponding to the power pins 1 to 6. The bottom of the BGA 10 is shown by a cross-section along the dot-chain line of FIG. 1A. The 3.3V power layer 15 is connected through the vias 19 to 21 to the power pins 1 to 3, while the 5V power layer 16 is connected through the vias 22 to 24 to the power pins 4 to 6.

Instead of preparing the reference voltage $V_2$ inside the OBP 13, a voltage output from the other OBP 14 generating the 5V voltage is divided by a voltage division circuit (formed on the printed circuit board 12, but not shown) to prepare a 3.3V reference voltage $V_2$.

The BGA 10 is actually supplied with a plurality of types of power voltage and signals. For this reason, the printed circuit board 12 includes, though not shown, a plurality of other power layers and signal patterns.

Figure 2:
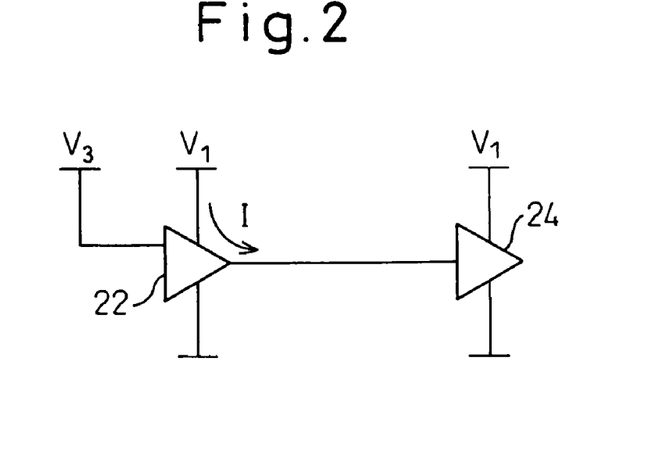
FIG. 2 shows an example of a circuit included in the BGA.

FIG. 2 shows one example of a circuit included in the BGA. In the figure, 22 indicates a driver and 24 a receiver. The BGA has inside it a driver circuit and a receiver circuit. The driver and the receiver are connected by connecting different BGAs. A single BGA never has the driver and receiver connected inside it. If considering this by FIG. 2, 22 and 24 show the case of a different BGA driver circuit and receiver circuit connected by patterns on a printed circuit board. The driver 22 is supplied with the 3.3V power voltage $V_1$ and auxiliary power voltage $V_3$, while the receiver 24 is supplied with the 3.3V power voltage $V_1$. These power voltages are output from the OBP 13 and are supplied through the power layer 15 to the power pins 1 to 3.

Figure 3:
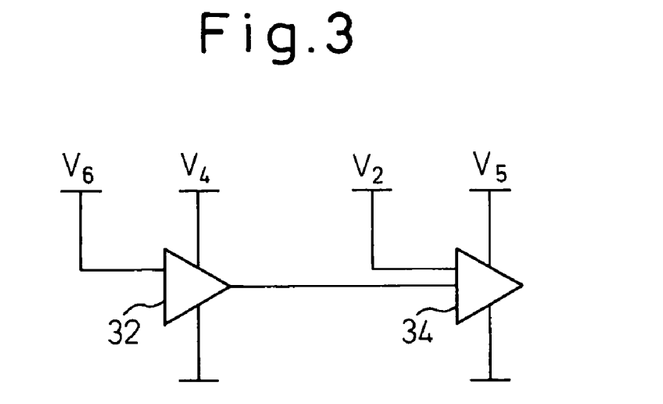
FIG. 3 shows another example of a circuit included in the BGA.

FIG. 3 shows another example of a circuit included in the BGA. In the figure, 32 indicates a driver and 34 a receiver. The driver 32 is supplied with the 5V power voltage $V_4$ and the auxiliary power voltage $V_6$, while the receiver 34 is supplied with the 5V power voltage $V_5$. These power voltages are output from the OBP 14 and supplied through the power layer 16 to the power pins 4 to 6.

The reference voltage $V_2$ shown in FIG. 2 is used as the criteria for judgment as to if the output voltage of the driver 32 of the circuit shown in for example FIG. 3 is the high level or low level. For example, when the output voltage of the driver 32 is higher than 3.3V, it is judged that the voltage is the high level, while when it is 3.3V or less, it is judged as the low level.

For reference to this related art, see Japanese Patent Publication (A) No. 2-003957, Japanese Patent Publication (B) No. 7-120227, and Japanese Patent Publication (A) No. 6-223632.

In the case of a component like a BGA where a plurality of voltage power supplies are required, as shown in FIGS. 1A and 1B, the situation where the $V_1$, $V_2$, and $V_3$ are the same voltages, but the applications differ frequently occurs in practice. In this example, the driver-receiver power voltage $V_1$ of FIG. 2 is a voltage the same as the receiver reference voltage $V_2$ of FIG. 3. Further, physically, for example when using a 1 mm pitch BGA, since the distances between pins is in the narrow region of 1 mm, the pins are easily affected by each other in structure. In the circuit of FIG. 2, when a current I flows through the driver 22, a noise in accordance with that current, that is, $V_n = LdI/dt$, occurs at the power layer 15 and as a result the power layer 15 fluctuates in voltage and the reference voltage $V_2$ fluctuates. This being the case, the reference voltage for judging if the output voltage of the driver 32 of the circuit shown in FIG. 3 is the high level or low level will fluctuate. For example, if the reference voltage $V_2$ changes to 3.5V and the output voltage of the driver 32 is 3.4V, while originally speaking the output of the driver 32 should be the high level, the change of this reference voltage causes it to be misjudged as the low level and therefore has a detrimental effect on the quality of transmission. Further, depending on the component, the component may also contain pins requiring an analog system power supply (PLL: phase-locked loop). In general, an analog system power supply is sensitive to noise, so for example even if the same voltage as the digital system power supply, physical separation is necessary. This is also one example where the voltages are the same, but the applications differ, so separation would be better.

Further, there were the problem that a printed circuit board included a large number of power layers and signal layers and therefore the number of conductor layers provided in the printed circuit board was large and the dimensions became larger and the problem that if trying to make the printed circuit board smaller in thickness, the conductor layers became greater in mounting density and production became difficult. For example, when the BGA 10 is a 1152-pin field programmable gate array (FPGA), there are 3.3V Vccaux pins (eight pins), but specification-wise, these Vccaux pins have to be activated before all of the other power supplies (Vcc and Vref). For this reason, in the past, two separate layers, that is, a Vccaux power layer and a Vcco and Vref power layer, were necessary.

SUMMARY OF THE INVENTION

An object of the present invention is to improve the quality of transmission of an electrical component.

Another object of the present invention is to reduce the mounting density of conductor layers included in a printed circuit board in a power feed device so as to facilitate the production of the printed circuit board or to reduce the number of conductor layers included in a printed circuit board so as to realize a smaller size of the printed circuit board.

To achieve the above object, the first aspect of the present invention provides a power feed device for an electrical component, comprising a power bar having conductive projections provided in shapes and at positions corresponding to the shapes and positions of the electrodes of the electrical component and provided at the outside of a printed circuit board and by feeding power from a power supply from the conductive projections of the power bar to electrodes of the electrical component.

According to the first aspect of the present invention, since the power bar is provided at the outside of the printed circuit board, it is possible to reduce the mounting density of the printed circuit board and to simplify the production of the printed circuit board.

According to a second aspect of the present invention, the printed circuit board is provided between the power bar and the electrical component, and power fed to the power bar is fed from the conductive projections through vias passing through the printed circuit board to the electrodes of the electrical component.

According to the second aspect of the present invention, since the power bar is connected to the electrical component through vias of the printed circuit board, the power bar is not affected by voltage fluctuations of a power layer in the printed circuit board, therefore the quality of transmission of signals in the electrical component can be improved.

According to a third aspect of the present invention, the power bar is provided between the printed circuit board and the electrical component, and power fed to the power bar is directly fed from the conductive projections to the electrodes of the electrical component without going through vias.

According to the third aspect of the present invention, since the power bar is directly connected to the electrical component without going through vias of the printed circuit board, compared with the case of connection through vias, it is possible to reduce the effects of high frequency noise.

According to a fourth aspect of the present invention, the power supply is at least one power supply generating at least two types of voltage, the printed circuit board includes at least one power layer for supplying part of the voltage generated by the power supply to part of the electrodes of the electrical component, and the power bar feeds one of the remaining voltages generated by the power supply to the other electrodes of the electrical component through vias passing through the printed circuit board by being electrically connected to the other electrodes and being insulated from the at least one power layer included in the printed circuit board.

According to the fourth aspect of the present invention, since the power bar is insulated from the power layer in the printed circuit board, the power bar is not affected by voltage fluctuations of the power layer in the printed circuit board, therefore the quality of transmission of signals in the electrical component can be improved.

According to a fifth aspect of the present invention, there are a plurality of power supplies, and there are a plurality of power bars corresponding to the electrodes of the plurality of power supplies.

According to the fifth aspect of the present invention, even when there are a plurality of power supplies, since power bars corresponding to these plurality of power supplies are provided outside of the printed circuit board, it is possible to further reduce the mounting density of the printed circuit board and realize further simplification of the production of the printed circuit board.

According to a still further aspect of the present invention, one power source generating one type of voltage and the electrical component are connected by a power bar, no power layer is formed in the inner layers, and the power bar alone is used to feed power, whereby it is possible to reduce the number of layers of the printed circuit board.

According to a still further aspect of the present invention, one power source generating one type of voltage and the electrical component are connected by a power bar, a power layer is also formed in the inner layers, and the power bar and inner layer power layer are used to feed power in parallel, whereby it is possible to reduce any voltage drop. At that time, the vias connecting the power bar and the electrical component are connected to the inner layer power layer. In this example, the power bar and the power layer are connected in parallel to certain power pins of the electrical component.

According to a still further aspect of the present invention, one power source generating one type of voltage and the electrical component are connected by a power bar, a power layer is also formed in the inner layers, but when the voltage fed from the power bar and the voltage fed from the inner layer power layer are equal, but differ in nature (method of use, in one example, when Vref and Vcco, which are differ in nature, happen to be the same voltage 3.3V etc.), the vias connecting the power bar and the electrical component are insulated from the inner layer power layer, whereby it is possible to reduce the effect of noise. In this example, it is assumed that the electrical component has a plurality of types of power pins, one of which is fed with power from the power bar and the others of which are fed with power from the inner layer power layer.

BRIEF DESCRIPTION OF THE DRAWINGS

These and other objects and features of the present invention will become clearer from the following description of the preferred embodiments given with reference to the attached drawings, wherein:

FIG. 1A is a plan view, as seen from below, of a BGA fed with power by a conventional power feed device, while

FIG. 10A is a plan view of a power feed device according to Example 6 of the present invention, while

FIGS. 12A to 12D are plan views of a power feed device according to Example 7 of the present invention, wherein FIG. 12A is a plan view of a BGA 10, FIG. 13A is a plan view of a multi-power supply power bar shown in FIGS. 12A to 12D, while

DESCRIPTION OF THE PREFERRED EMBODIMENTS

Below, preferred embodiments of the invention will be explained in detail with reference to the attached drawings.

EXAMPLE 1

Figure 4A:
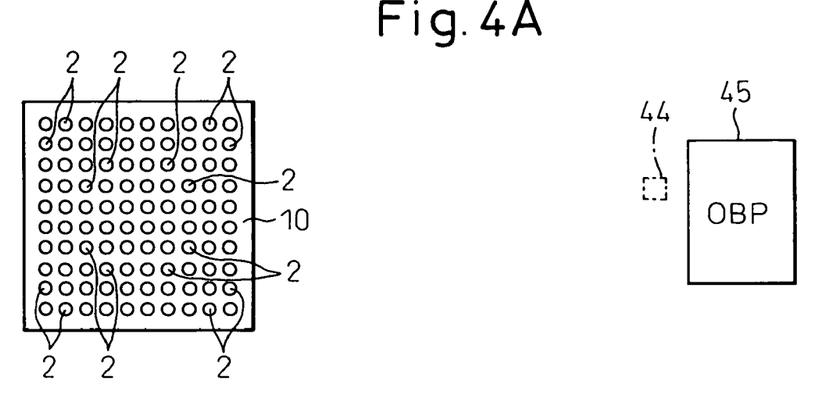
FIGS. 4A to 4C are views for explaining the basic configuration of a power feed device according to Example 1 of the present invention.
Figure 4B:
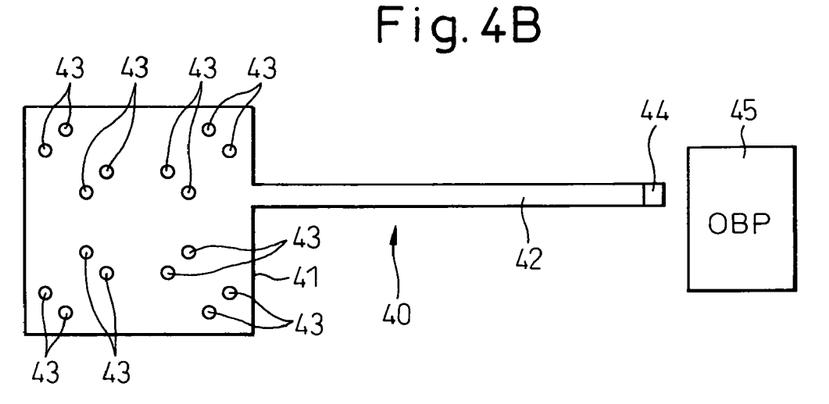
Figure 4C:
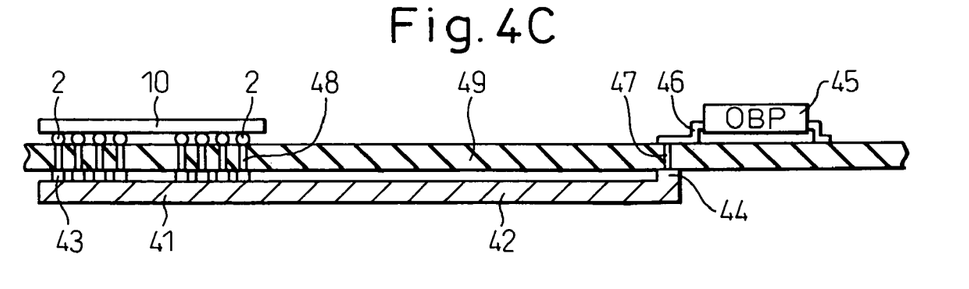

FIGS. 4A to 4C are views for explaining the basic configuration of a power feed device according to Example 1 of the present invention. FIG. 4A is the same as the conventional view shown in FIG. 1A of the BGA 10 as seen from the back. FIG. 4A shows only the power pins 2 comprised of solder balls. Reference numeral 45 shown at the right of the BGA 10 is an OBP, while reference numeral 44 shown by the dotted lines indicates a conductive pattern formed on the back surface of the printed circuit board 49 (see FIG. 4C) for electrically contacting the power bar 41.

FIG. 4B is a plan view of the power bar 40. As illustrated, the power bar 40 is comprised of a main body part 41 of substantially the same shape as the BGA 10 and a bar part 42. The width of the bar part 42 is shown as being narrower than the width of the main body part 41, but does not necessarily have to be narrower. It may also be made wider when there is a reason such as keeping the voltage drop low. The main body part 41 is provided with cylindrical conductive projections 43 at positions corresponding to the power pins 2 of the BGA 10. For simplification, the explanation will be given by an arrangement of conductive projections 43 in chip on hole (COH) mounting forming vias 48 at the same positions as the power pins 2. When not COH mounting, the vias are not at the same positions as the footprints (not shown) of the power pins 2, so the conductive projections 43 are formed at the same positions as not the power pins 2, but the vias guiding patterns led out from the power pins 2 to the inner layers. The conductive projections 43 are not limited in shapes to cylinders.

FIG. 4C is a cross-sectional view of a power feed device according to Example 1. As illustrated, the output power pin 46 of the OBP 45 arranged at the right side of the printed circuit board 49 in the illustration is electrically connected to the conductive projection 44 at the end of the bar part 42 of the power bar 40 via the via 47. At the left side of the printed circuit board 49 in the illustration, the BGA 10 is mounted. The power pins 2 of the BGA 10 are electrically connected through vias 48 passing through the printed circuit board 49 with conductive projections 43 of the main body part 41 of the power bar 40 mounted at the bottom side of the printed circuit board 49. The main body part 41 of the power bar 40 is connected through the bar part 42 to the pattern 44 formed at the bottom side of the printed circuit board 49. The pattern 44 is connected through the via 47 and the output power pin 46 of the OBP 45 to the OBP 45. The BGA 10 and OBP 45 are mounted by an ordinary reflow process on the printed circuit board 49. The power bar 40 can also be similarly mounted, but if the power bar is thick or when large in volume, it will become larger in heat capacity and may conceivably be hard to raise in temperature by the reflow heat. In this case, the power bar 40 may be fastened to the printed circuit board 49 by screws etc. The parts of the printed circuit board 49 other than the not shown signal layers and power layers are insulators.

According to the basic configuration of the power feed device shown in FIGS. 4A to 4C, since the power bar 40 is provided outside of the printed circuit board 49, it becomes possible to reduce the number of the power layers inside the printed circuit board 49.

EXAMPLE 2

Figure 5:
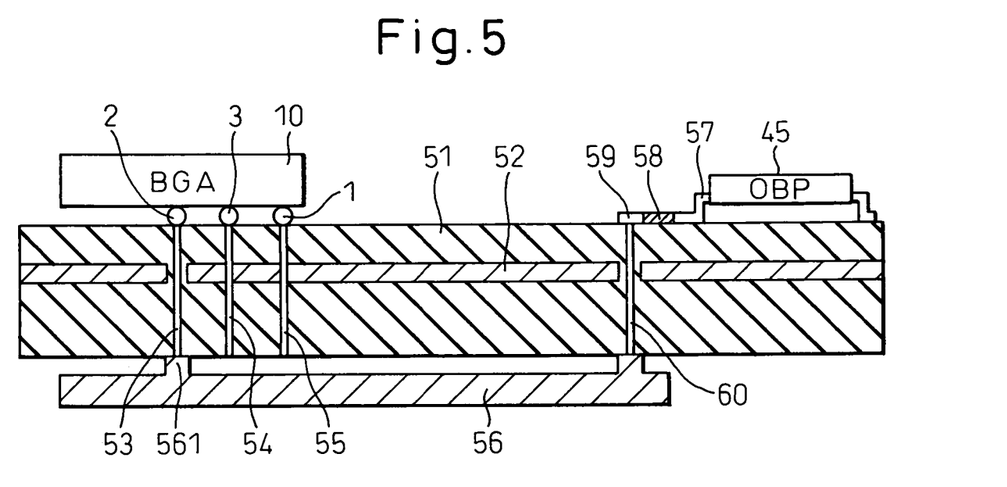
FIG. 5 is a cross-sectional view of a power feed device according to Example 2 of the present invention.

FIG. 5 is a cross-sectional view of a power feed device according to Example 2 of the present invention. In the figure, parts the same as in FIG. 1B are assigned the same reference numerals, and explanations are omitted. Reference numeral 51 indicates a printed circuit board, 52 a power layer of conductive patterns included in the printed circuit board, 53 to 55 vias passing through the printed circuit board 51, 56 a power bar provided outside of the printed circuit board 51 according to the present invention, 45 an OBP, 57 an output power pin of the OBP 45, 58 a conductive pattern arranged on the printed circuit board 51 and electrically connected with the output power pin 57, 59 a planar pattern electrically connected with the conductive pattern 58, 60 a via electrically connecting the planar pattern 59 and the power bar 56, and 561 conductive projections provided at the power bar 56 and connecting to the vias 53. The via 60 passes through the printed circuit board 51 and is insulated from the power layer 52 included in the printed circuit board 51. The parts of the printed circuit board 51 other than the power layer 52 and not shown signal layers and other power layers are insulators.

Each power pin 2 is fed with power from the OBP 45 through the output power pin 57, conductive pattern 58, planar pattern 59, via 60, power bar 56, a conductive projection 561, and a via 53. Each of the power pins 1 and 3 is fed with power from the OBP 45 through a not shown conductive path, the power layer 52 in the printed circuit board 51, and vias 54 and 55. In this example, the power pin 2 and power pins 1 and 3 are in the end fed with power from the same OBP 45, so are not completely electrically insulated from each other, but are connected at an electrically distant location, so for example for noise occurring at a power pin 1 to reach a power pin 2, it would have to make a considerable detour of the via 55→power layer 52→OBP 45→via 60→power bar 56→projection 561→via 53→power pin 2. This route includes inductance components, so high frequency noise would find it hard to follow along this route and the noise would not be a substantive problem in level.

According to this configuration, the voltage applied to each power pin 2 becomes completely free of the effect of any fluctuation in the voltage applied to the power pins 1 and 3. Therefore, even if utilizing the voltage applied to a power pin 2 as the reference voltage for judging if the output of a driver of a circuit in the BGA 10 is the high level or low level, it is possible to avoid the misjudgment like in the past.

EXAMPLE 3

Figure 6:
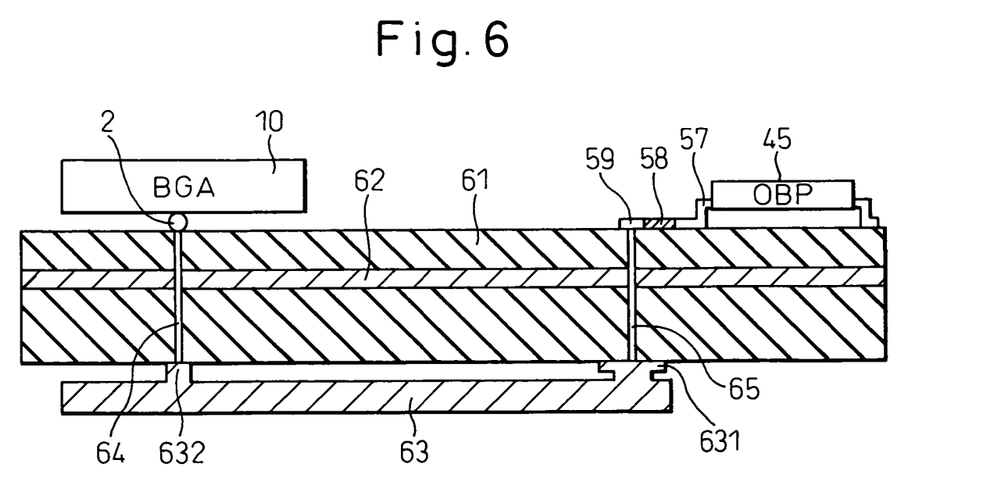
FIG. 6 is a cross-sectional view of a power feed device according to Example 3 of the present invention.

FIG. 6 is a cross-sectional view of a power feed device according to Example 3 of the present invention. In the figure, parts the same as in FIG. 5 are assigned the same reference numerals, and explanations are omitted. In Example 3, a power layer 62 inside the printed circuit board 61 and a power bar 63 provided outside the printed circuit board 61 are connected in parallel by vias 64 and 65. That is, at the right side of the power bar 63 in the illustration, the surface 59 connected with the lead 57 of the OBP 45 by the pattern 58 and the footprint 631 of the power bar 63 are connected by the via 65 passing through the printed circuit board 61, and this via 65 is connected to the power layer 62 included in the printed circuit board 61. At the left side of the power bar 63 in the illustration, conductive projections 632 of the power bar 63 and power pins 2 of the BGA 10 are electrically connected through the vias 64. Due to this parallel connection, it becomes possible to reduce the apparent electrical resistance of the power layer 62. For example, when the power layer 62 and the power bar 63 are the same in lengths and the power layer 62 has a thickness in cross-section of 35 µm and a width of 285 mm, if using a power bar 63 with a width in cross-section of 5 mm and a thickness of 2 mm, the cross-sectional area becomes the same, so the power layer 62 and the power bar 63 become the same in resistance value. If connecting these in parallel, the electrical resistance becomes half that of the case of the power layer 62 alone. Due to this, the voltage drop of the power layer 62 is halved. The power bar may be freely selected in width and thickness.

EXAMPLE 4

Figure 7:
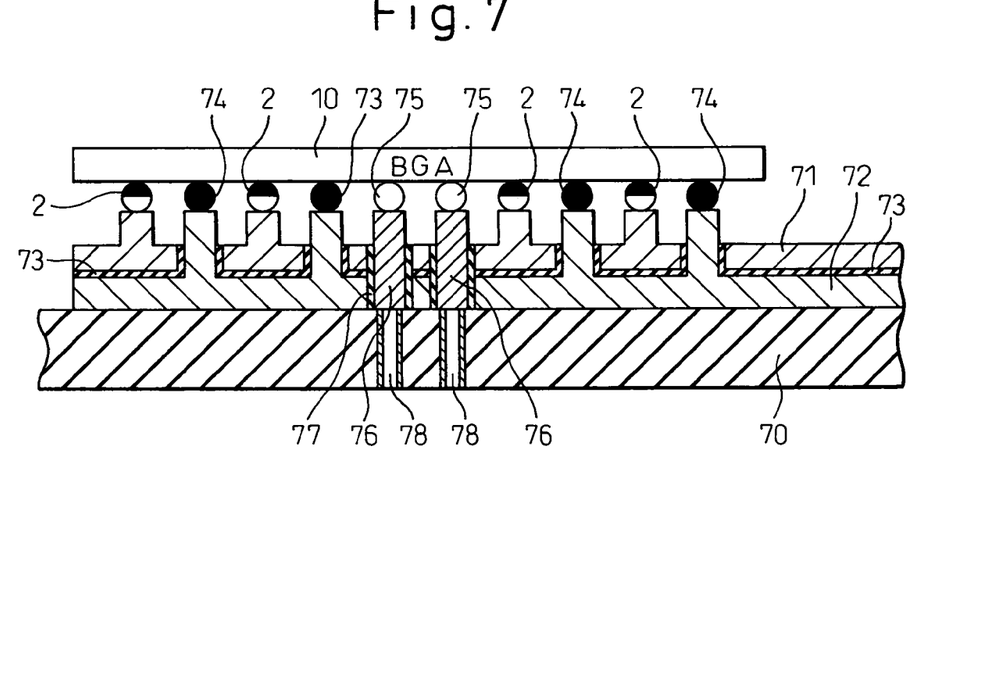
FIG. 7 is a cross-sectional view of a power feed device according to Example 4 of the present invention.

FIG. 7 is a cross-sectional view of a power feed device according to Example 4 of the present invention. In the figure, parts the same as in FIG. 5 are assigned the same reference numerals, and explanations are omitted. In Example 4, a power bar 71 and ground bar 72 are provided between the BGA 10 and the printed circuit board 70. The power bar 71 and the ground bar 72 are electrically separated by an insulating layer 73. The BGA 10 is provided with not only reference voltage power pins 2, but also ground use power pins 74 and signal transmission use signal pins 75. Reference numeral 76 shows connection pins for connecting the signal pins 75 to a signal layer (not shown) included in the printed circuit board 70, while 77 shows insulators for electrically insulating the signal pins 75 from the power bar 71 and ground bar 72. The connection pins 76 are cylindrically shaped, while the insulators 77 are shaped as hollow tubes able to surround them. The signal pins 75 of the BGA 10 are connected through connection pins 76 passing through the power bar 71 and insulation layer 73 and ground bar 72 to the vias 78. The power bar 71, ground bar 72, and insulating layer 73 are formed with holes of passage of the signal pins 76. The vias 78 are connected with a signal layer (not shown) in the printed circuit board 70. The connection pins 76 are connected to the vias 78 by reflow soldering, or the power bar 71 and ground bar 72 themselves are fastened by screws (not shown) to the printed circuit board 70 for connection to the signal layer included in the printed circuit board 70.

Due to this configuration, the power bar and ground bar also are directly connected to the BGA 10 without going through vias of the printed circuit board, so there is an effect of reduction of the high frequency noise. In general, vias in a printed circuit board have large inductances in the high frequency region and pose major problems even when the printed circuit board is at most 2 mm or so in thickness. Since the power bar is directed connected to the BGA 10 without going through the printed circuit board (that is, the vias), this is extremely effective as a measure against high frequency noise.

EXAMPLE 5

Figure 8:
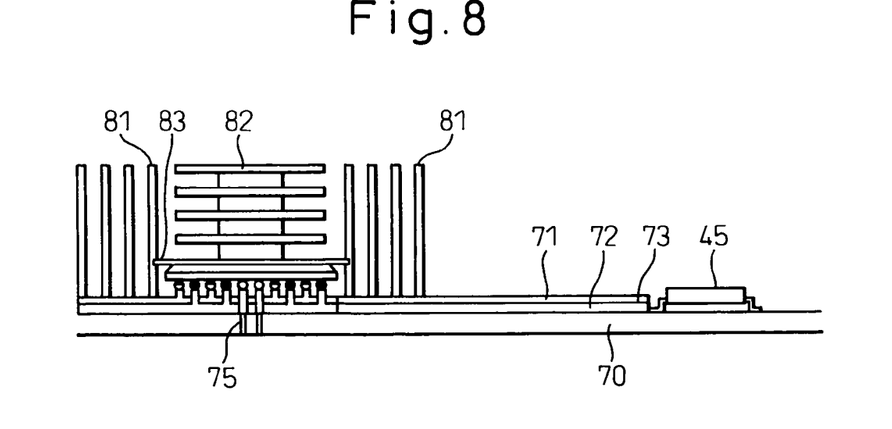
FIG. 8 is a cross-sectional view of a power feed device according to Example 5 of the present invention.

FIG. 8 is a cross-sectional view of a power feed device according to Example 5 of the present invention. In the figure, parts the same as in FIG. 7 are assigned the same reference numerals, and explanations are omitted. A power bar 71 is made from copper or another metal originally having a high electric conductivity, so by providing part of the power bar 71 with at least one of plate type heat radiating fins 81 and disk type heat radiating fins 82, it is possible to obtain a heat radiating structure. Further, if providing part of the plate type heat radiating fins 81 with slits 83 to enable part of the disk type heat radiating fins 82 to slide, a further larger heat radiating effect is obtained.

Figure 9:
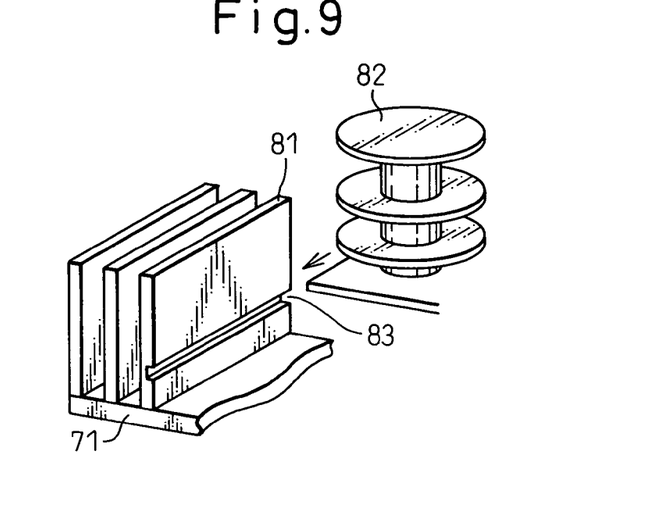
FIG. 9 is an enlarged view showing part of FIG. 8.

FIG. 9 is an enlarged view showing an example of providing part of the plate type heat radiating fins 81 explained in FIG. 8 with slits 83 to enable part of the disk type heat radiating fins 82 to slide.

EXAMPLE 6

Figure 10A:
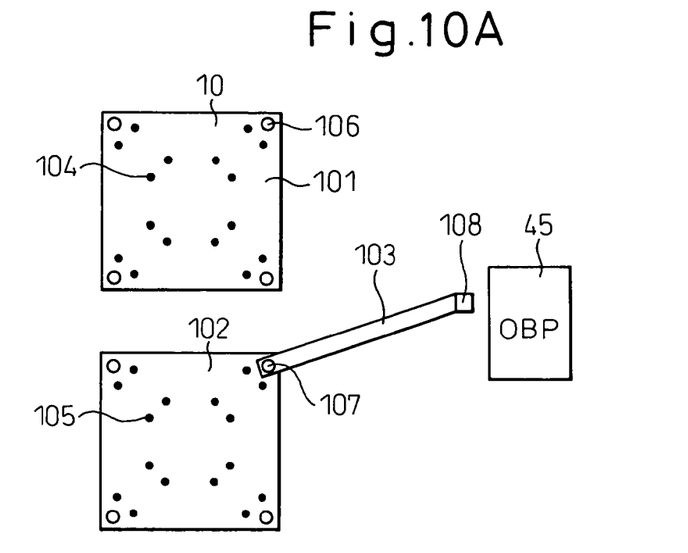
Figure 10B:
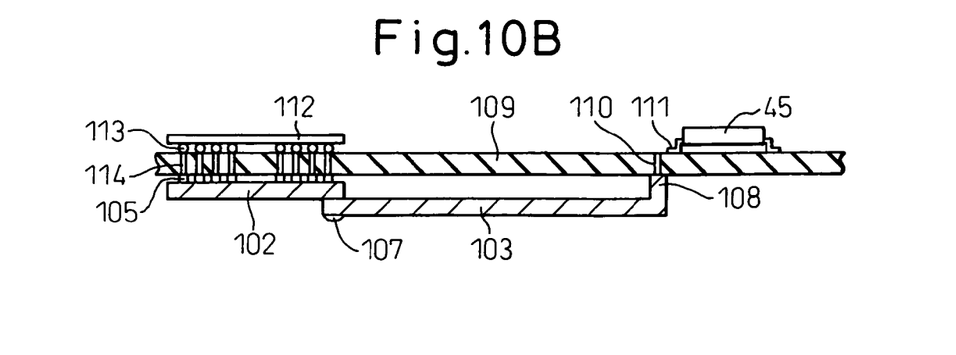
FIG. 10B is a cross-sectional view of a power feed device according to Example 6 of the present invention.

FIG. 10A is a plan view of a power feed device according to Example 6 of the present invention, while FIG. 10B is a cross-sectional view of a power feed device according to Example 6 of the present invention. In FIGS. 10A and 10B, reference numerals 101 and 102 indicate main body parts of a power bar, 103 an arm part of the power bar, 104 a conductive projection provided at a position corresponding to the, for example, Vref power pin of a BGA on the main body part 101 of the power bar, 105 a conductive projection provided at a position corresponding to the for example Vref power pin of the BGA on the main body part 102 of the power bar, 106 a screw hole for connecting an end of the arm part 103 and the main body part 101 of the power bar and forming a female screw structure, 107 a screw for connecting the end of the arm part 103 and the main body part 102 of the power bar, 108 a conductive pattern connected to the end of the arm part 103, 109 a printed circuit board, 110 a via connecting an output power pin 111 of the OBP 45 and the conductive pattern 108, 112 an electrical component as constituted by the BGA, 113 a for example Vref power pin of the BGA, and 114 a via for electrically connecting a power pin 113 and conductive projection.

As shown in FIGS. 10A and 10B, according to Example 6, the main body parts and the arm parts of the power bar are produced separately and the arm parts 103 can be screwed to the desired main body parts in accordance with need. Conversely speaking, in the power feed devices from Examples 1 to 5, it was necessary to prepare a different shaped power bar each time the positions of the BGA and the OBP changed, but in Example 6, by separately preparing the main body parts and arm parts of the power bar, no matter what the positional relationship between the BGA and OBP, it becomes possible to use the same main body parts.

Figure 11:
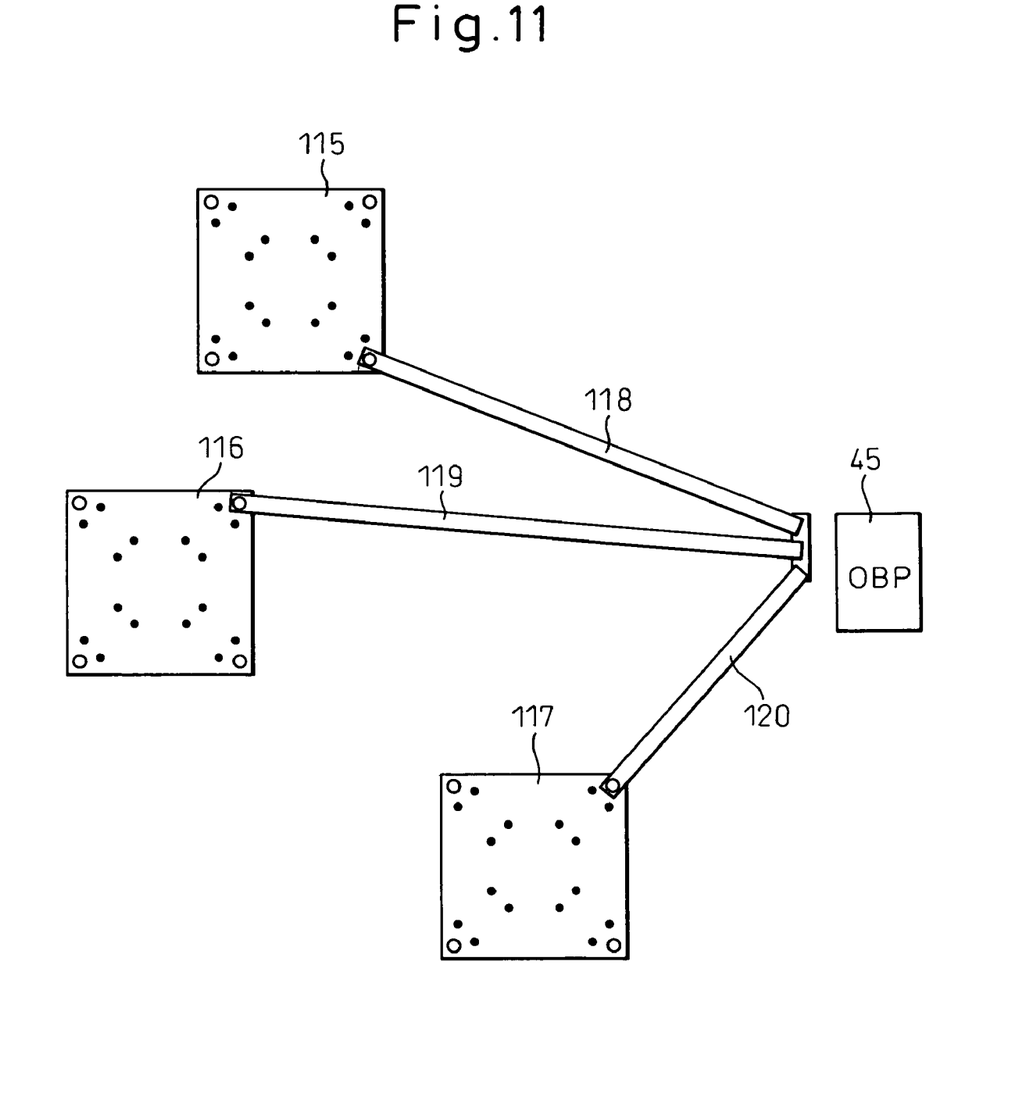
FIG. 11 is a plan view of a power feed device showing an example of application of Example 6 of the present invention.

FIG. 11 is a plan view of a power feed device showing an example of application of Example 6. In the figures, 115 to 117 indicate three main body parts of the power bar, while 118 to 120 indicate three arm parts. In this way, even when the main body parts 115 to 117 of the power bar are arranged at positions different in direction and distance with respect to the OBP 45, by making the arm parts of the power bar lengths matching the positions of these main body parts, it becomes possible to connect the OBP 45 and the main body parts of the power bar arranged at any positions.

EXAMPLE 7

Figure 12A:
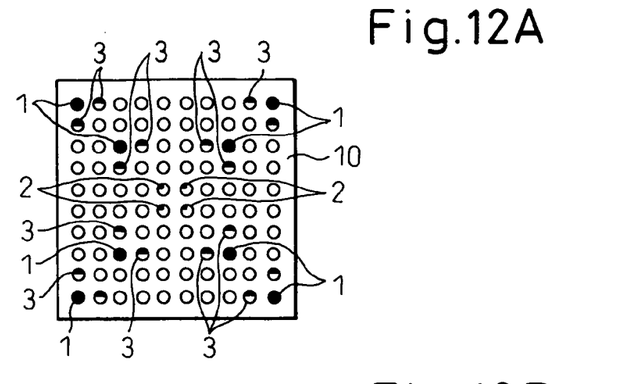
Figure 12B:
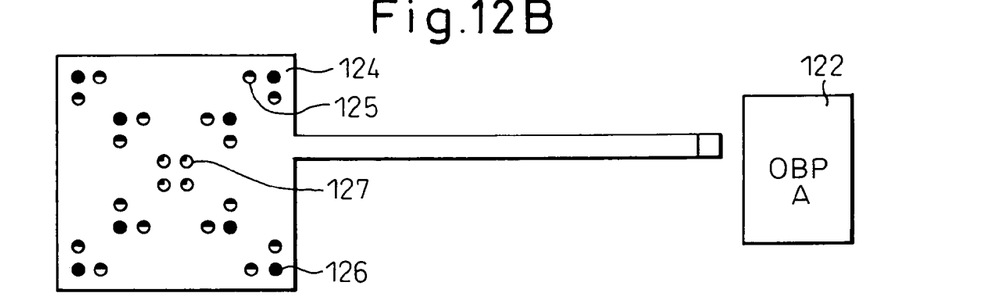
FIG. 12B is a plan view of a power supply A side power bar.
Figure 12C:
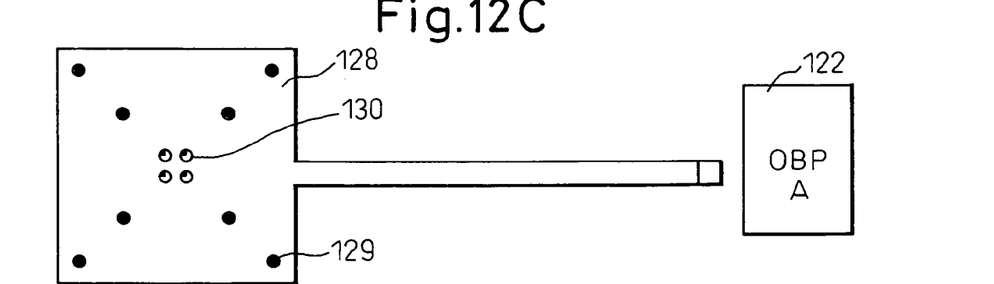
FIG. 12C is a plan view of a ground side power bar.
Figure 12D:
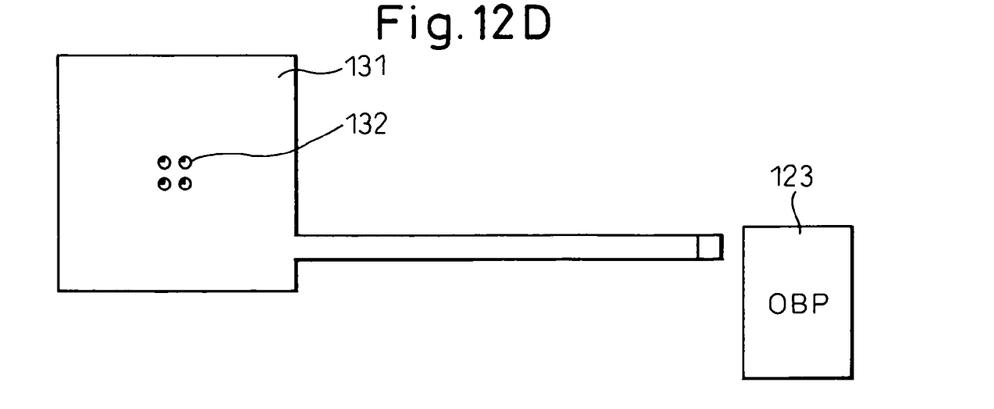
FIG. 12D is a power supply B side power bar.

FIGS. 12A to 12D are plan views of a power feed device according to Example 7 of the present invention. In the figures, FIG. 12A is a plan view of a BGA 10, FIG. 12B is a plan view of a power supply A side power bar, FIG. 12C is a plan view of a ground side power bar, and FIG. 12D is a plan view of a power supply B side power bar. In this way, in the present example, a single BGA has two power supplies 122 (A) and 123 (B) connected to it.

The BGA 10 shown in FIG. 12A is the same as that shown in FIGS. 1A and 1B and is provided with ground pins 1, power pins 2, and power pins 3.

In FIG. 12B, 124 indicates a power bar connected to a power supply A side 122 and provided at its main body part with cylindrical conductive projections 125 corresponding to the power pins 3, holes 126 corresponding to the ground pins 1, and holes 127 corresponding to the power pins 2.

In FIG. 12C, 128 indicates a ground side power bar connected to the power supply A side 122 and provided at its main body part with cylindrical conductive projections 129 corresponding to the ground pins 1 and holes 130 corresponding to the power pins 2.

In FIG. 12D, 131 indicates a power bar connected to the power supply B side 123 and provided at its main body part with cylindrical conductive projections 132 corresponding to the power pins 2. By superposing these three power bars 124, 128, and 131, a multi-power supply power bar can be realized.

Figure 13A:
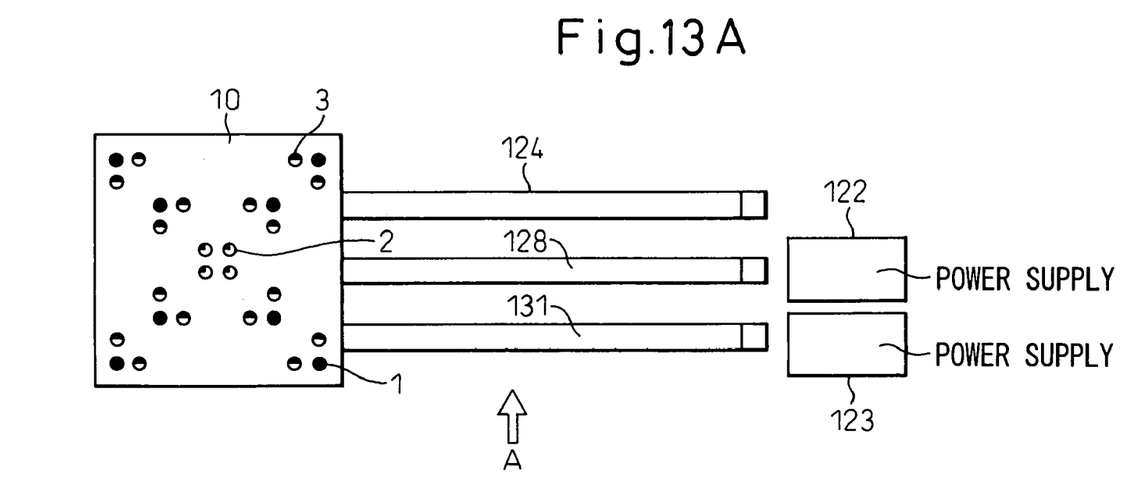
Figure 13B:
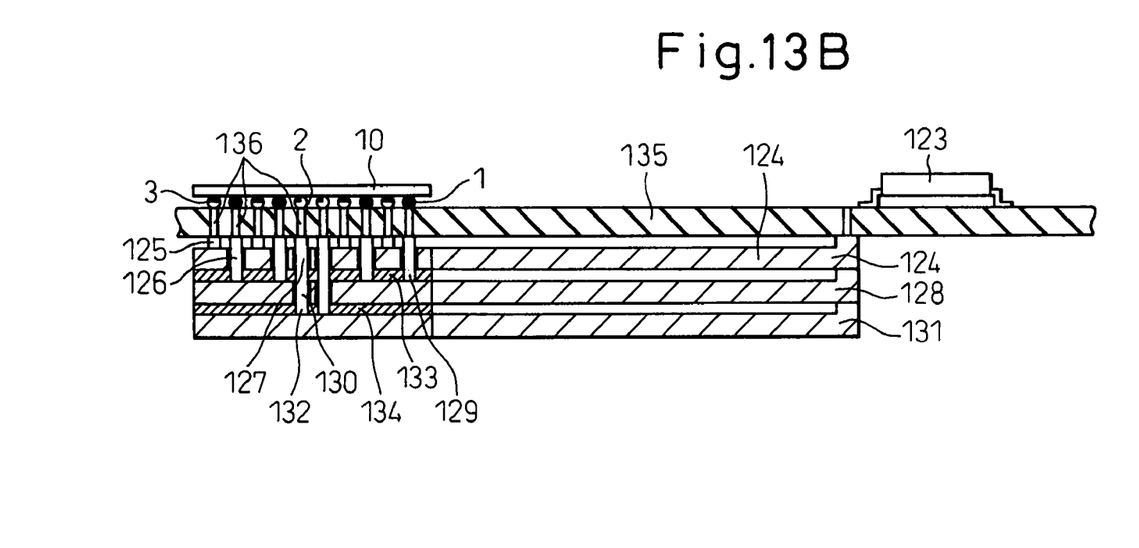
FIG. 13B is a cross-sectional view of a multi-power supply power bar.

FIG. 13A is a plan view of the multi-power supply power bar shown in FIGS. 12A to 12D, while FIG. 13B is a cross-sectional view of a multi-power supply power bar as seen from the arrow A direction in FIG. 13A. As will be understood from FIG. 13A, the bar parts of the power bars are arranged offset in the lateral direction. In FIG. 13B, 133 indicates an insulating layer between the power bar 124 and the main body part of the power bar 128, 134 indicates an insulating layer between the power bar 128 and the main body part of the power bar 131, and 135 indicates a printed circuit board. The conductive projections 125 are connected through vias 136 of the printed circuit board 135 to the power pins 3, the conductive projections 129 are fit into the holes 126 and connected through the vias 136 to the ground pins 1, and the conductive projections 132 are fit into the holes 127 and connected through the vias 136 to the power pins 2. The cylindrical shaped surroundings of the holes 126 corresponding to the ground pins 1 are electrically insulated from the power bar 124 by air insulation or insulating layers. Similarly, the cylindrical shaped surroundings of the holes 130 corresponding to the power pins 2 are electrically insulated from the power bar 124 and ground side power bar 128 by air insulation or insulating layers. In the example shown in FIGS. 12A to 12D and FIGS. 13A and 13B, the case of two power supplies is shown, but even if the number of power supplies is three or more, this can be similarly dealt with by adding power bars under the printed circuit board 132 and holes in the power bars superposed with the same.

As clear from the above explanation, according to the present invention, by arranging a power bar at the outside of a printed circuit board, it is possible to reduce the number of power layers included in the printed circuit board and thereby possible to reduce the mounting density of the printed circuit board and simplify the production of the printed circuit board. Further, the power bar is free from the effects of any voltage fluctuations of a power layer in the printed circuit board and therefore the quality of transmission of the signals in the electrical component can be improved. Further, by having the power bar directly connected to the electrical component without going through vias of the printed circuit board, compared with the case of connection through vias, it is possible to reduce the effect due to high frequency noise. Further, since the power bar is insulated from the power layer in the printed circuit board, the power bar is free from the effects of any voltage fluctuations in the power layer in the printed circuit board and therefore the quality of transmission of the signals in the electrical component can be improved. Further, even if there are a plurality of power supplies, since power bars corresponding to the plurality of power supplies are provided outside of the printed circuit board, the mounting density of the printed circuit board can be further reduced and the production of the printed circuit board can be further simplified.

While the invention has been described with reference to specific embodiments chosen for purpose of illustration, it should be apparent that numerous modifications could be made thereto by those skilled in the art without departing from the basic concept and scope of the invention.

The invention claimed is:

1. A power feed device for an electrical component comprising:
    a power supply for supplying power;
    a printed circuit board having signal line patterns; and
    a power bar having a plurality of conductive projections provided in shapes and at positions corresponding to the shapes and positions of electrodes of said electrical component and provided outside of said printed circuit board, power from said power supply being supplied through said conductive projections of said power bar to electrodes of said electrical component,
    wherein said power bar is provided between said printed circuit board and said electrical component, and power supplied to said power bar is directly fed from said conductive projections to electrodes of said electrical component without going through vias.

2. A power feed device as set forth in claim 1, wherein said power bar is provided with a main body part of the same shape as the electrical component and an arm part connecting the main body part and the power supply, the arm part being connected to the main body part in a detachable manner.

3. A power feed device as set forth in claim 1, wherein the power bar has a plurality of main body parts and arm parts corresponding to the plurality of electrical components, there is a single power supply, and the arm parts are connected between the plurality of main body parts and the power supply.

* * * * *